(12) United States Patent
Koizumi

(10) Patent No.: US 8,721,913 B2
(45) Date of Patent: May 13, 2014

(54) LEAD-BASED PIEZOELECTRIC MATERIAL AND PRODUCTION METHOD THEREFOR

(75) Inventor: Takaaki Koizumi, Tajimi (JP)

(73) Assignee: NGK Insulators, Ltd., Nagoya (JP)

( * ) Notice: Subject to any disclaimer, the term of this patent is extended or adjusted under 35 U.S.C. 154(b) by 232 days.

(21) Appl. No.: 13/285,462

(22) Filed: Oct. 31, 2011

(65) Prior Publication Data

US 2012/0104309 A1 May 3, 2012

(30) Foreign Application Priority Data

Nov. 2, 2010 (JP) ................................. 2010-246730

(51) Int. Cl.
*B32B 7/02* (2006.01)
(52) U.S. Cl.
USPC .............. 252/62.9; 977/812; 252/62.9 R; 501/134; 423/598; 423/594.12
(58) Field of Classification Search
USPC ....... 977/812; 252/62.9 R, 62.9 PZ; 501/134; 423/598, 594.12
See application file for complete search history.

(56) References Cited

U.S. PATENT DOCUMENTS 3,699,044 A * 10/1972 Dosch et al. ........... 252/62.9 PZ
5,112,433 A * 5/1992 Dawson et al. ............ 423/593.1
7,704,321 B2 4/2010 Riman et al.
2006/0133988 A1* 6/2006 Kurozumi et al. ............ 423/598
2007/0265357 A1* 11/2007 Iversen et al. ..................... 516/1

FOREIGN PATENT DOCUMENTS

JP 11-116395 A1 4/1999
JP 2009-203105 9/2009

OTHER PUBLICATIONS

Extended European Search Report, European Application No. 11187175.2, dated Jun. 29, 2012 (10 pages).
Katagiri et al. "Crystallization of Monodisperse Lead Zirconate Titanate Nanoparticles Produced by Laser Ablation," Japanese Journal of Applied Physics, Japan Society of Applied Physics, JP, vol. 43, No. 7A, Jul. 1, 2004 (6 pages).
Suchanek et al. "Hydrothermal Synthesis of Ceramic Materials," Chapter 18, In: D.A. Palmer, R. Fernandez-Prini and A.H. Harvey (editors): "Aqueous Systems at Elevated Temperatures and Pressures" 2004 (28 pages).
Traianidis et al. "Mechanism of PZT Crystallisation Under Hydrothermal Conditions Development of a New Synthesis Route," Journal of the European Ceramic Society, Elsevier Science Publishers, Barking, Essex, GB, vol. 20, No. 16, Jan. 1, 2000 (8 pages).

* cited by examiner

*Primary Examiner* — Carol M Koslow
(74) *Attorney, Agent, or Firm* — Burr & Brown, PLLC

(57) ABSTRACT

A lead-based particulate piezoelectric material has a median diameter of less than 1 μm and a particle size distribution expressed by [arithmetic deviation/mean] of no greater than 15% and in which no less than 85% of all particles are cubic.

5 Claims, 1 Drawing Sheet

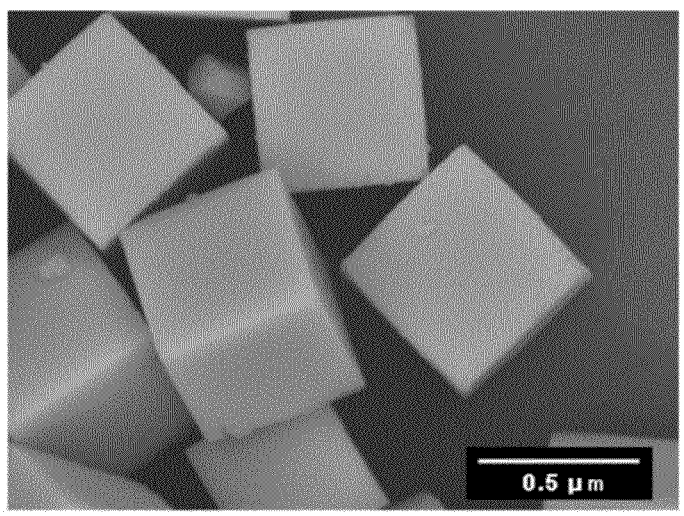

LEAD-BASED PIEZOELECTRIC MATERIAL AND PRODUCTION METHOD THEREFOR

CROSS-REFERENCE TO RELATED APPLICATIONS

This application claims priority to Japanese Patent Application No. 2010-246730 filed on Nov. 2, 2010. The entire disclosure of Japanese Patent Application No. 2010-246730 is hereby incorporated herein by reference.

BACKGROUND OF THE INVENTION

1. Field of the Invention

The present invention relates to a lead-based piezoelectric material and a production method therefor.

2. Description of the Related Art

Lead-based piezoelectric materials such as lead zirconate titanate (PZT) are used in various devices.

As proposed in Japanese Laid-Open Patent Application H11-116395A (hereinafter referred to as Patent Document 1), one example of a method for applying PZT to devices is a method in which PZT particles are sintered. In this regard, Patent Document 1 states that a solid phase technique, which is generally used as a method for producing PZT particles, is problematic in that the particle size of the resulting PZT particles is large, and a high sintering temperature is required.

To lower the sintering temperature, Patent Document 1 proposes a method for producing PZT particles having a small particle size.

In particular, in Patent Document 1, an aqueous solution of $Pb(NO_3)_2$, an aqueous solution of $ZrOCl_2$, an aqueous solution of $TiCl_4$, and an aqueous solution of KOH are mixed and stirred to give precursor particles, and the precursor particles are subjected to hydrothermal treatment to give PZT particles.

SUMMARY OF THE INVENTION

The present inventors have focused on the fact that the use of particles of a piezoelectric material as a seed allows a crystal-oriented ceramic with a high degree of orientation to be grown. The seed is also referred to as a template.

An object of the present invention is to provide a lead-based piezoelectric material that attains large coverage when two-dimensionally aligned and that can be suitably used as a seed.

As such a lead-based piezoelectric material usable as a seed, the inventors achieved a novel lead-based piezoelectric material that is small and whose particle size is highly uniform. In addition, the inventors developed a material that is preferably used to obtain such a lead-based piezoelectric material.

The lead-based particulate piezoelectric material according to the first aspect of the present invention has an average particle diameter in the range of 5 nm to 30 nm and a particle size distribution expressed by [arithmetic deviation/mean] of no greater than 10%. For convenience, this lead-based piezoelectric material is sometimes referred to as "nanopowder". The nanopowder is preferably used to obtain the lead-based piezoelectric material according to the second aspect of the present invention below.

The lead-based particulate piezoelectric material according to the second aspect of the present invention has a median diameter of less than 1 μm, and a particle size distribution expressed by [arithmetic deviation/mean] of no greater than 15%, and no less than 85% of all particles are cubic.

The production method according to the third aspect of the present invention is a method for producing of the lead-based piezoelectric material of the second aspect described above, the method including growing particles by a hydrothermal method using nanoparticles as nuclei.

The lead-based particulate piezoelectric material in which the median diameter is less than 1 μm, the particle size distribution expressed by [arithmetic deviation/mean] is no greater than 15%, and no less than 85% of all particles are cubic attains large coverage when two-dimensionally aligned and is preferably used in the production of a crystal-oriented ceramic.

BRIEF DESCRIPTION OF THE DRAWINGS

FIG. 1 is an SEM image of submicron particles obtained in Example 1.

DETAILED DESCRIPTION OF THE INVENTION

1. Nanopowder

The term "nanopowder" as used herein refers to a lead-based particulate piezoelectric material having a mean particle diameter in the range of 5 to 30 nm and a particle size distribution expressed by [arithmetic deviation/mean] of no greater than 10%. That is, the nanopowder is an aggregate of nano-sized particles (i.e., nanoparticles) of the lead-based piezoelectric material.

The term "lead-based piezoelectric material" as used herein refers to a piezoelectric material containing at least lead (Pb).

The term "piezoelectric material" as used herein includes a substance that generates an electric charge when a pressure is applied as well as a substance that deforms when an electric field is applied. The concept of "piezoelectricity" as used herein includes "electrostriction."

The lead-based piezoelectric material may have a perovskite structure represented by a general formula $ABO_3$. Also, the lead-based piezoelectric material may contain oxygen, and may contain two or more elements in addition to lead and oxygen. Specifically, the lead-based piezoelectric material may have a perovskite structure containing a total of three or more elements in the A-site and the B-site.

More specifically, the lead-based piezoelectric material may be at least one oxide selected from the group composed of $Pb(Zr,Ti)O_3$, $Pb(Mg,Nb)(Zr,Ti)O_3$, $Pb(Ni,Nb)(Zr,Ti)O_3$, $Pb(Zn,Nb)(Zr,Ti)O_3$, $Pb(Yb,Nb)(Zr,Ti)O_3$, $(Pb,Sr)(Zr,Ti)O_3$, $(Pb,Ba)(Zr,Ti)O_3$, $(Pb,La)(Zr,Ti)O_3$, $(Bi,Pb)(Ni,Nb)(Zr,Ti)O_3$, $(Bi,Pb)(Mg,Nb)(Zr,Ti)O_3$, $(Bi,Pb)(Zn,Nb)(Zr,Ti)O_3$, $(Pb,Sr,La)(Mg,Ni,Nb)(Zr,Ti)O_3$, $PbTiO_3$, $Pb(Mg,Nb)TiO_3$, $Pb(Ni,Nb)TiO_3$, and $Pb(Zn,Nb)TiO_3$.

The diameter of the particles contained in the nanopowder can be determined by observation under, for example, a scanning electron microscope (SEM) or a transmission electron microscope (TEM). Here, the particle diameter refers to the equivalent circle diameter, and in particular, the diameter of a circle equivalent to a projected area (Heywood diameter).

The particle size distribution of the nanopowder can be calculated by selecting a magnification at which the field of view of, for example, a SEM or a TEM includes 20 to 50 particles having an equivalent circle diameter of no less than 5 nm, and performing particle recognition on the resulting image data using image-analyzing particle size distribution analysis software, and calculating the diameter of a circle equivalent to a projected area.

The mean particle diameter of the nanopowder can be statistically calculated by approximating it using a frequency histogram of equivalent circle diameters by normal distribution.

The nanopowder is suitably used in the production of submicron powder, which will be described below.

The nanopowder may be mixed with another substance, or may be dispersed in a medium.

To use the nanopowder in the production of submicron powder, which will be described below, the PZT intensity ratio of the nanopowder is preferably no less than 20%, more preferably no less than 50%, and even more preferably no less than 90%. The PZT intensity ratio may also be referred to as the extent of PZT synthesis, and indicates the proportion of the intensity for the PZT phase relative to the entire intensity in an X-ray diffraction (XRD) profile in the range of $2\theta=20$-$60°$.

2. Nanopowder Composition

The nanopowder composition contains at least one of an oxide and a hydroxide of at least one of the elements contained in the above-described lead-based piezoelectric material. That is, in the case where the lead-based piezoelectric material contains Pb, Zr, and Ti, the nanopowder composition contains, in addition to the above-described particles, at least one compound selected from the group consisting of PbO, $Pb(OH)_2$, $ZrO_2$, $Zr(OH)_4$, $TiO_2$, and $Ti(OH)_4$.

The nanopowder composition may contain a medium such as water. The oxide and the hydroxide as well as the above-described nanopowder may be dispersed and/or dissolved in the medium.

The nanopowder composition is applied to the production of submicron powder, which will be described below. In the case where a chelating agent such as EDTA is used in the production of submicron powder, while the atoms of the elements of the oxide or the hydroxide in the nanopowder composition reach equilibrium between a complex and a free body due to the chelating agent, it is likely that the presence of excessive atoms cause the growth rate of submicron particles to be appropriately adjusted.

3. Submicron Powder

The term "submicron powder" as used herein is a lead-based particulate piezoelectric material having a median diameter of less than 1 μm and a particle size distribution expressed by [arithmetic deviation/mean] of no greater than 15%. No less than 85% of all particles of the submicron powder are cubic. That is, the submicron powder is an aggregate of submicron-sized particles (i.e., submicron particles) of the lead-based piezoelectric material.

Herein, cubic particles includes particles having a substantially cubic shape in addition to, those having a perfectly cubic shape. That is, the cubic particles may be particles that have, on an image projected in the direction perpendicular to one surface of a particle, 2 pairs of opposing sides that form the sides of a substantially square shape (edges of a substantially cubic shape), and the ratio of a longer axis to a shorter axis that are perpendicular to a side of the respective pairs is 1.0 to 1.1, and the length of the straight portion of a side is no less than 50%, more preferably no less than 70%, and even more preferably no less than 80% of the distance between a plane to which the side belongs and the opposing plane (i.e., the particle size). The corners of the cubic particles may be rounded, or may be cut such that the particles are polyhedral. The particles can be observed under an SEM or TEM.

The particle size distribution of the submicron powder can be measured with an ordinary particle size analyzer, and can be measured according to, for example, dynamic light scattering method as described below.

The median diameter is a value that is also expressed as D50. When powder is divided into two groups with its median diameter as a boundary value, the amount of particles included in the respective groups is the same.

4. Production Method

The method for producing the submicron powder includes growing particles by a hydrothermal method using the nanoparticles as nuclei.

The conditions for performing the hydrothermal method is determined according to the desired composition of the lead-based piezoelectric material, the desired particle size, and like factors.

The submicron powder may be produced by a hydrothermal method that uses particles of the above-described nanopowder as nuclei.

An example of a method for producing the nanopowder is a method that uses a highly dispersing reaction field. That is, a solution that contains ingredients of the nanopowder as solutes (i.e., an ingredient solution) is brought into contact with a poor solvent for the ingredients, which has been processed into a thin film (i.e., a thin-film fluid). Thereby, the ingredients precipitate, and nanoparticles are formed. The liquid after the reaction between the ingredient solution and the thin-film fluid is included within the above-described nanopowder composition. The term "poor solvent" as used herein is a solvent in which the solutes of the ingredient solution are barely soluble. The species of the poor solvent and the solvent of the ingredient solution may be different, and the same solvent may be used but at different temperatures, pressures, etc.

The specific conditions under which a method for producing the nanopowder is performed is determined according to the desired composition of the lead-based piezoelectric material, the desired particle size, and like factors. Specifically it is preferable to satisfy at least one of the following conditions when performing a method that uses a highly dispersing reaction field:

a temperature of room temperature to 200° C., a pressure of 0.01 to 2 MPa, a flow ratio of the ingredient solution to the thin-film fluid (thin-film fluid/ingredient solution) of 0.5 to 12000, and a revolution for obtaining a thin-film fluid of 30 to 3500 rpm.

EXAMPLES

1. Production of PZT Particles 1-1. Nucleus Formation

Examples 1 to 10

An aqueous lead solution containing lead acetate trihydrate (manufactured by Kanto Chemical Co., Inc.) and potassium hydroxide (manufactured by Kanto Chemical Co., Inc.); an aqueous zirconium solution containing zirconyl chloride octahydrate (manufactured by Kanto Chemical Co., Inc.); an aqueous titanium chloride solution (manufactured by Wako Pure Chemical Industries, Ltd.); and an aqueous potassium hydroxide solution containing potassium hydroxide (manufactured by Kanto Chemical Co., Inc.) were provided. The aqueous solutions were mixed so as to attain a Pb, Zr, and Ti molar ratio of Pb:Zr:Ti=1.1:0.7:0.3, thus giving an ingredient solution S.

The components of ingredient solutions S, the components of thin-film fluids T, the reaction temperature, and the pressure shown in Table 1 were used in combination for Examples 1 to 10 to precipitate PZT.

For precipitation, a device was used in which one disk is a stationary disk and the other is a rotating disk, and the rotation of the rotating disk can form a thin-film fluid layer. For example, a synthesizer for highly dispersed particles ULREA SS-11 (manufactured by M Technique Co., Ltd.) can be used as such a device.

The number of revolutions of the rotating disk was 500 rpm. An ingredient solution S was introduced into a fluid T that had been processed into a thin film by the rotation of the rotating disk, to precipitate PZT. All of the combined fluids (hereinafter referred to as a slurry U) were collected. The slurry U corresponds to the above-described nanopowder composition.

In Example 6, first, PbTiOx, or an intermediate solution, was formed using an ingredient solution containing the components shown in the upper row for Example 6 in Table 1 (Pb, Ti, and K) and a thin-film fluid. Addition of Zr and K to the intermediate solution produced an ingredient solution containing the components shown in the lower row (PbTiOx, Zr, and K).

The slurries U obtained in this manner were used to form PZT particles as described below.

Example 11

An ingredient solution S was provided by dissolving lead acetate (manufactured by Kanto Chemical Co., Inc.) in 2-methoxyethanol (manufactured by Kanto Chemical Co., Inc.), adding tetraisopropoxide (manufactured by Kojundo Chemical Laboratory Co., Ltd.) and tetrabutoxyzirconium (manufactured by Kojundo Chemical Laboratory Co., Ltd.), adding acetylacetone (manufactured by Kanto Chemical Co., Inc.), sufficiently stirring, and adding a mixed solvent (a water content of 1.5 wt %) of water and isopropyl alcohol (manufactured by Kanto Chemical Co., Inc.). Meanwhile, pure water was used as a thin-film fluid T.

Under the conditions shown in Table 1, a slurry was obtained in the same manner as in the above-described Examples 1 to 10.

Example 12

An ingredient solution S for fine PZT particles was provided by dissolving diisopropoxylead (manufactured by Kojundo Chemical Laboratory Co., Ltd.), tetraisopropoxide, and tetrabutoxyzirconium in isopropyl alcohol, adding ethyl acetoacetate, and a mixed solvent (a water content of 1.5 wt %) of water and isopropyl alcohol. Meanwhile, pure water was used as a thin-film fluid T. Under the conditions shown in Table 1, a slurry was obtained in the same manner as in the above-described Examples 1 to 10.

TABLE 1

| Ex. No. | Component of ingredient solution S | Component of thin-film fluid T | Temperature (° C.) | Pressure (MPa) | Flow ratio |
| --- | --- | --- | --- | --- | --- |
| Ex. 1 | Pb, Zr, Ti, K | K | 25 | 0.2 | 200 |
| Ex. 2 | Pb, Zr, Ti, K | K | 100 | 0.2 | 200 |
| Ex. 3 | Pb, Zr, Ti, K | K | 150 | 1.0 | 200 |
| Ex. 4 | Pb, Zr, Ti, K | K | 200 | 2.0 | 200 |
| Ex. 5 | Pb, Zr, Ti | K | 150 | 1 | 200 |
| Ex. 6 | Pb, Ti, K | K | 150 | 1 | 200 |
|  | PbTiOx, Zr, K | K | 150 | 1 | 200 |
| Ex. 7 | Pb, Zr, Ti, K | Ethanol | 150 | 1 | 200 |
| Ex. 8 | Pb, Zr, Ti, K | K | 150 | 1 | 10 |
| Ex. 9 | Pb, Zr, Ti, K | K | 150 | 1 | 1000 |
| Ex. 10 | Pb, Zr, Ti, K | K | 150 | 1 | 10000 |
| Ex. 11 | Pb, Zr, Ti | (Pure water) | 25 | 0.2 | 1000 |
| Ex. 12 | Pb, Zr, Ti | (Pure water) | 25 | 0.2 | 1000 |

1-2. Particle Growth

Examples 1 to 12

An ingredient solution S' for a particle growth process was prepared by mixing an aqueous lead solution containing lead acetate trihydrate (manufactured by Kanto Chemical Co., Inc.), ethylenediaminetetraacetate (manufactured by Kanto Chemical Co., Inc.), and potassium hydroxide (manufactured by Kanto Chemical Co., Inc.); an aqueous zirconium solution containing zirconyl chloride octahydrate (manufactured by Kanto Chemical Co., Inc.); an aqueous titanium chloride solution (manufactured by Wako Pure Chemical Industries, Ltd.); and an aqueous potassium hydroxide solution containing potassium hydroxide (manufactured by Kanto Chemical Co., Inc.) such that the Pb, Zr, and Ti molar ratio was Pb:Zr:Ti=1.1:0.7:0.3.

The pH of a slurry U was adjusted, and 10 ml of the slurry U and 20 ml of the ingredient solution S' were introduced into a 100 ml SUS pressure vessel having a polytetrafluoroethylene inner wall. With this pressure vessel, a hydrothermal synthesis was performed at 20° C. for 2 hours, thus giving PZT particles. The above-described operation was performed using the slurries U of Examples 1 to 12.

Comparative Example 1

An ingredient solution was prepared by mixing an aqueous lead solution containing lead acetate trihydrate (manufactured by Kanto Chemical Co., Inc.), ethylenediaminetetraacetate (manufactured by Kanto Chemical Co., Inc.), and potassium hydroxide (manufactured by Kanto Chemical Co., Inc.); an aqueous zirconium solution containing zirconyl chloride octahydrate (manufactured by Kanto Chemical Co., Inc.); an aqueous titanium chloride solution (manufactured by Wako Pure Chemical Industries, Ltd.); and an aqueous potassium hydroxide solution containing potassium hydroxide (manufactured by Kanto Chemical Co., Inc.) such that the Pb, Zr, and Ti molar ratio was Pb:Zr:Ti=1.1:0.7:0.3. Then, 30 ml of the ingredient solution was introduced into a 100 ml SUS pressure vessel having a polytetrafluoroethylene inner wall, and a hydrothermal synthesis was performed at 165° C. for 4 hours, thus giving PZT particles.

Comparative Example 2

An aqueous lead solution containing lead acetate trihydrate (manufactured by Kanto Chemical Co., Inc.), ethylenediaminetetraacetate (manufactured by Kanto Chemical Co., Inc.), and potassium hydroxide (manufactured by Kanto Chemical Co., Inc.); an aqueous zirconium solution containing zirconyl chloride octahydrate (manufactured by Kanto Chemical Co., Inc.); an aqueous titanium chloride solution (manufactured by Wako Pure Chemical Industries, Ltd.); and an aqueous potassium hydroxide solution containing potassium hydroxide (manufactured by Kanto Chemical Co., Inc.) were mixed such that the Pb, Zr, and Ti molar ratio was Pb:Zr:Ti=1.1:0.7:0.3. Moreover, 2.5 wt % of gelatin (manufactured by Jellice Co. Ltd) was added and sufficiently stirred by a disperser, and thus an ingredient solution was prepared. Then, 30 ml of the ingredient solution was introduced into a 100 ml SUS pressure vessel having a polytetrafluoroethylene inner wall, and a hydrothermal synthesis was performed at 165° C. for 4 hours, thus giving PZT particles.

2. Evaluation 2-1. Nucleus Particles

The XRD profiles in the range of 2θ=20-60° of the slurries obtained in section 1-1 above were obtained with an X-ray diffractometer (X'Pert MPD Pro manufactured by PANalytical). The ratio of the intensity for the PZT phase relative to the entire intensity in the range of 2θ=20-60° was calculated as the extent of PZT synthesis.

Under a field emission electron microscope (JSM-7000F, manufactured by JEOL Ltd.), a magnification at which the field of view included 20 to 50 particles having an equivalent circle diameter of no less than about 5 nm was selected, particle recognition was performed on the resulting image data using image-analyzing particle size distribution analysis software (Mac-View, manufactured by Mountech Co., Ltd.), and the diameter of a circle equivalent to a projected area was determined as the particle diameter. The mean particle diameter was statistically calculated by performing normal distribution approximation on a frequency histogram.

Also, a deviation was statistically calculated in the same manner, and as an indicator of particle size distribution, the deviation was divided by the mean particle diameter according to formula (1) to calculate the particle size distribution.

Particle size distribution=approximated normal distribution deviation/approximated normal distribution mean     (1)

2-2. Grown PZT Particles

The particle size distribution of grown PZT particles was measured with a dynamic light scattering particle size distribution analyzer Zetasizer Nano-ZS manufactured by Spectris Co., Ltd., and from the resulting data, the median diameter and the particle size distribution were obtained.

Moreover, the shape of the PZT particles was determined with a field emission electron microscope (JSM-7000F, manufactured by JEOL Ltd.). PZT particles were lightly spread over an SEM stage such that the particles did not overlap, a magnification at which the field of view included 20 to 50 particles was selected, and the particles were observed. The proportion of cubic particles was calculated from the obtained image data. Based on the obtained image, the projected area σ, the projected perimeter λ, and the area of the circumscribed circle Σ of the particles were obtained using image-analyzing particle size distribution analysis software, and then the circularity (=4 πσ/λ²) and the ratio of the projected area to the area of the circumscribed circle (=σ/Σ) was calculated. Particles having a circularity of no less than 1.092 and an area ratio of no less than 0.637 were selected. Among such particles, those having even-numbered pairs of opposed parallel sides on a projected image were regarded as cubes, and the proportion thereof was calculated.

The results are presented in Table 2. An image of the PZT particles of Example 1 is shown in FIG. 1.

TABLE 2

| | Nucleus particles | | | Grown PZT particles | | |
| --- | --- | --- | --- | --- | --- | --- |
| | Extent of synthesis (%) | Mean particle diameter (nm) | Particle size distribution (%) | Median diameter (μm) | Particle size distribution (arithmetic deviation/mean) (%) | Particle shape |
| Ex. 1 | 20 | 20 | 9 | 0.5 | 15 | Cubic |
| Ex. 2 | 55 | 17 | 8 | 0.5 | 10 | Cubic |
| Ex. 3 | 100 | 11 | 8 | 0.6 | 9 | Cubic |
| Ex. 4 | 100 | 5 | 9 | 0.4 | 12 | Cubic |
| Ex. 5 | 25 | 16 | 7 | 0.7 | 13 | Cubic |
| Ex. 6 | 100 | 20 | 8 | 0.5 | 9 | Cubic |
| Ex. 7 | 100 | 8 | 7 | 0.9 | 8 | Cubic |
| Ex. 8 | 100 | 14 | 9 | 0.5 | 10 | Cubic |
| Ex. 9 | 100 | 21 | 8 | 0.5 | 9 | Cubic |
| Ex. 10 | 100 | 5 | 6 | 0.4 | 12 | Cubic |
| Ex. 11 | 80 | 15 | 9 | 0.8 | 10 | Cubic |
| Ex. 12 | 75 | 10 | 8 | 0.7 | 15 | Cubic |
| Comp. Ex. 1 | — | | | 2 | 20 | Cubic |
| Comp. Ex. 2 | — | | | 0.5 | 43 | Substantially cubic or indeterminate |

As shown in Table 2 and FIG. 1, the nucleus particles of Examples 1 to 12 had a mean particle diameter in the range of 5 to 30 nm and a particle size distribution of no greater than 10%. The PZT particles grown using those particles as nuclei were a lead-based piezoelectric material having a median diameter of submicron order and a particle size distribution of no greater than 15%, and no less than 85% of all particles were cubic.

Also, it was confirmed that the ratio of the longer axis to the shorter axis of the obtained particles was 1.0 to 1.1 and thus the length of the sides of a substantially square shape was no less than 80% of the particle size. It was confirmed that in Comparative Example 2, on the other hand, no less than 20% of the particles were not substantially cubic, having a spherical shape or a deformed spherical, cubic, or like imperfect shape.

3. Production of Oriented Ceramic

To evaluate the properties of the PZT particles obtained in section 1-2 above as seeds for an oriented ceramic, the PZT particles were two-dimensionally aligned, and the degree of particle density was determined based on the in-plane coverage. A specific preparation method is as follows.

A platinum green body having a width of 1 mm, a length of 40 mm, and a thickness of 10 μm was screen-printed over a zirconia substrate having a size of 30 mm×30 mm and a thickness of 150 μm. A platinum electrode (first electrode) was formed on the substrate by calcining at 1350° C. using an electric furnace. Meanwhile, an aqueous pyrrole solution was prepared by adding sodium dodecylbenzenesulfonate and pyrrole to 30 ml of pure water so as to attain 0.01 mol/l. The prepared aqueous solution was introduced into a beaker, and cubic PZT particles having a particle size of 3 μm prepared by a hydrothermal method was added to the aqueous solution in an amount of 1 wt %, and a dispersing treatment was performed with a homogenizer, thus giving a suspension (monomer slurry).

Next, the above-described zirconia substrate was placed in the bottom of the beaker containing the monomer slurry, and the beaker was left to stand still for 10 minutes until PZT particles precipitated. Next, an SUS counter electrode was provided at an electrode interval of 1 mm so as to be parallel to the substrate, and connected to a power source such that the platinum electrode on the substrate was a negative electrode and the counter electrode was a positive electrode. A 2 Hz triangular wave with a peak voltage of 5 V was applied 30 times in order to form polypyrrole on the platinum electrode.

The substrate on which a film of polypyrrole had been formed was shaken in an aqueous solution to roughly remove excessive particles and then subjected to ultrasonic cleaning in pure water to remove PZT particles other than those adhering to the platinum electrode. In this manner, a particle-anchored article having an anchoring layer in which a film of PZT particles was anchored to only the platinum electrode was obtained. The surface of the first electrode on which the anchoring layer had been formed was observed under an SEM, and the proportion of the area covered with particles relative to the electrode area was quantified by analyzing the SEM image to give coverage (the extent of particle coverage per unit area of the electrode). The results are presented in Table 3.

TABLE 3

|  | Coverage |
|---|---|
| Example 1 | 93% |
| Comparative Example 2 | 69% |

As shown in Table 3, the use of the submicron powder of Example I resulted in a higher coverage than the use of the powder of Comparative Example 2.

INDUSTRIAL APPLICABILITY

The lead-based particulate piezoelectric material of submicron order provided by the present invention is cubic and has a narrow particle size distribution. Such a lead-based piezoelectric material two-dimensionally aligns readily and thus is useful as a seed for growing an oriented ceramic.

What is claimed is:
1. A piezoelectric material composition comprising:
  a lead-based piezoelectric material having a mean particle diameter in a range of 5 to 30 nm, and a particle size distribution of no greater than 10%, the particle size distribution being expressed by [arithmetic mean/mean]; and
  at least one of an oxide and a hydroxide of at least one of elements contained in the lead-based piezoelectric material.
2. A lead-based piezoelectric material according to claim 1, comprising two or more elements in addition to lead and oxygen.
3. A lead-based particulate piezoelectric material having:
  a median diameter of less than 1 μm, and
  a particle size distribution of no greater than 15%, the particle size distribution being expressed by [arithmetic deviation/mean], wherein
  no less than 85% of all particles are cubic.
4. The lead-based piezoelectric material according to claim 3, comprising two or more elements in addition to lead and oxygen.
5. A method for producing a lead-based piezoelectric material of claim 3, including growing particles by a hydrothermal method using a nanoparticle as a nuclei, wherein a lead-based piezoelectric material is used as the nuclei, said material having a mean particle diameter in a range of 5 to 30 nm, and a particle size distribution of no greater than 10%, the particle size distribution being expressed by [arithmetic deviation/mean].

\* \* \* \* \*